US010117027B2

(12) United States Patent
Pahl

(10) Patent No.: US 10,117,027 B2
(45) Date of Patent: Oct. 30, 2018

(54) MICROPHONE AND METHOD FOR PRODUCING A MICROPHONE

(71) Applicant: EPCOS AG, München (DE)

(72) Inventor: Wolfgang Pahl, München (DE)

(73) Assignee: TDK Corporation, Tokyo (JP)

( * ) Notice: Subject to any disclaimer, the term of this patent is extended or adjusted under 35 U.S.C. 154(b) by 19 days.

(21) Appl. No.: 15/307,814

(22) PCT Filed: Apr. 22, 2015

(86) PCT No.: PCT/EP2015/058724
§ 371 (c)(1),
(2) Date: Oct. 29, 2016

(87) PCT Pub. No.: WO2015/169600
PCT Pub. Date: Nov. 12, 2015

(65) Prior Publication Data
US 2017/0070825 A1 Mar. 9, 2017

(30) Foreign Application Priority Data

May 8, 2014 (DE) ...................... 10 2014 106 503

(51) Int. Cl.
| | |
|---|---|
| *H04R 19/04* | (2006.01) |
| *B81C 1/00* | (2006.01) |
| *H04R 1/28* | (2006.01) |
| *H04R 19/00* | (2006.01) |
| *H04R 31/00* | (2006.01) |
| *B81B 7/00* | (2006.01) |

(52) U.S. Cl.
CPC ........... *H04R 19/04* (2013.01); *B81B 7/0048* (2013.01); *B81C 1/00134* (2013.01); *H04R 1/2892* (2013.01); *H04R 19/005* (2013.01); *H04R 31/00* (2013.01); *B81B 2201/0257* (2013.01); *H04R 2410/03* (2013.01); *H04R 2499/11* (2013.01)

(58) Field of Classification Search
CPC . B81B 7/0048; B81C 1/00134; H04R 19/005; H04R 19/04; H04R 31/00; H04R 1/2892
See application file for complete search history.

(56) References Cited

U.S. PATENT DOCUMENTS

| | | | |
|---|---|---|---|
| 7,286,680 B2 | 10/2007 | Steeman et al. | |
| 8,218,794 B2* | 7/2012 | Pahl | ........................ H04R 1/04 381/355 |
| 8,531,018 B2 | 9/2013 | Pahl | |
| 2009/0127697 A1 | 5/2009 | Pahl | |

(Continued)

FOREIGN PATENT DOCUMENTS

| | | |
|---|---|---|
| DE | 102004011148 B3 | 11/2005 |
| DE | 102006046292 A1 | 4/2008 |

(Continued)

*Primary Examiner* — Brian Ensey
(74) *Attorney, Agent, or Firm* — Slater Matsil, LLP

(57) ABSTRACT

A microphone and a method for producing a microphone are disclosed. The microphone includes a substrate, a spring element plastically elongated in a direction perpendicular to the substrate, a transducer element in electrical contact with the substrate by way of the spring element and a cover to which the transducer element is fastened, the cover is arranged in such a way that the transducer element is arranged between the cover and the substrate.

15 Claims, 3 Drawing Sheets

(56) References Cited

U.S. PATENT DOCUMENTS

| | | |
|---|---|---|
| 2009/0232336 A1 | 9/2009 | Pahl |
| 2010/0183174 A1 | 7/2010 | Suvanto et al. |
| 2011/0044479 A1 | 2/2011 | Sun et al. |
| 2011/0135122 A1 | 6/2011 | Awamura et al. |
| 2013/0010995 A1 | 1/2013 | Kim et al. |
| 2013/0142374 A1* | 6/2013 | Lee .................. H04R 31/00 381/361 |
| 2014/0036466 A1 | 2/2014 | Pahl et al. |

FOREIGN PATENT DOCUMENTS

| | | |
|---|---|---|
| DE | 102010012042 A1 | 9/2011 |
| DE | 102010054782 A1 | 6/2012 |
| EP | 1191810 A1 | 3/2002 |
| EP | 1655996 A2 | 5/2006 |
| JP | 2010505304 A | 2/2010 |
| JP | 2013546193 A | 12/2013 |
| WO | 2007045204 A1 | 4/2007 |
| WO | 2008040326 A1 | 4/2008 |
| WO | 2012079927 A1 | 6/2012 |
| WO | 2014052559 A1 | 4/2014 |

* cited by examiner

MICROPHONE AND METHOD FOR PRODUCING A MICROPHONE

This patent application is a national phase filing under section 371 of PCT/EP2015/058724, filed Apr. 22, 2015, which claims the priority of German patent application 10 2014 106 503.4, filed May 8, 2014, each of which is incorporated herein by reference in its entirety.

TECHNICAL FIELD

The present invention relates to a microphone and to a method for producing a microphone. It may be in particular a condenser microphone.

BACKGROUND

Such a microphone has a transducer element, which must be encapsulated in a package. In order to allow good recording quality in the case of such a microphone, a rear volume that is as large as possible is required, since the sensitivity of the microphone for the recording of pressure variations is improved by a large rear volume. Furthermore, the expenditure for the internal electrical interconnections in the microphone should be kept down and the transducer element protected from mechanical stress.

DE 10 2004 011148 B3 discloses a microphone in which a microphone chip is encapsulated by means of a cover and a sound insulator. The microphone chip is also fastened on a substrate by way of a rigid fastening device. In the case of this microphone, strong mechanical couplings occur both between the cover and the microphone chip and between the microphone chip and the substrate. The couplings may impair the functioning of the microphone chip and also lead to a temperature-dependent behavior of the system.

U.S. Pat. No. 8,218,794 B2 discloses a further microphone. In the case of this microphone, the microphone chip is fastened on the substrate by way of a spring, the spring being produced photolithographically by the removal of a sacrificial layer. The deposition and later removal of the sacrificial layer involve considerable expenditure of time and material, so that the sacrificial layer can only be produced in a commercially viable way with a small height.

SUMMARY OF THE INVENTION

Embodiments of the invention provide an improved microphone that overcomes at least one of the aforementioned disadvantages. Further embodiments provide a method for producing such a microphone.

A microphone is proposed, having a substrate, a spring element, which is plastically elongated in a direction perpendicular to the substrate, a transducer element, which is in electrical contact with the substrate by way of the spring element, and a cover, to which the transducer element is fastened and which is arranged in such a way that the transducer element is arranged between the cover and the substrate.

The plastic elongation of the spring element allows it to have a great clear height. The clear height dictates the maximum distance between an underside of the spring element that is facing the substrate and an upper side of the substrate that is facing the transducer element. In this distance there is a free space between the underside of the spring element and the upper side of the substrate.

A spring element with a great clear height is suitable for compensating for great production tolerances. In the case of the present microphone, production tolerances occur in various parameters. These include for example the height of the transducer element, the height of the cover and the height of the spring element. Furthermore, bending and distortion of the cover may lead to further tolerances. The production tolerances mentioned here add up and lead overall to a not inconsiderable uncertainty with respect to the position of the transducer element.

However, the spring element is capable of compensating for these production tolerances, since it allows movements of the transducer element in relation to the substrate, whereby the production tolerances can be compensated. All that is necessary for a movement of the transducer element in relation to the substrate is for a spring force of the spring element to be overcome. This spring force is low in the case of small displacements of the relative movement.

Here, the transducer element is arranged between the cover and the substrate in particular in such a way that the cover, the transducer element and the substrate include a space that forms a rear volume of the transducer element. Accordingly, the transducer element has a large rear volume, whereby a great sensitivity of the transducer element can be ensured.

The spring element by way of which the transducer element is in electrical contact with the substrate represents a mechanical fastening of the transducer element to the substrate. However, this fastening is resiliently designed and is accordingly virtually free of forces. It consequently differs decisively from the rigid fastening of the transducer element to the cover, since it allows the transducer element to follow a movement of the cover without being exposed to great mechanical stress.

The present microphone accordingly allows the transducer element to be protected from mechanical stress. Mechanical stress occurs for example when the cover moves in relation to the substrate. This may happen for example as a result of a change in temperature, if the substrate and the cover experience different degrees of thermal distortion. Also when the microphone is installed in an external housing, forces may be exerted on the cover and lead to a deformation of the cover, for example when the cover is pressed against a sealing ring.

The spring element allows the transducer element to be protected from mechanical stress, since it provides a certain mechanical decoupling between the transducer element and the substrate, in that it allows movements of the transducer element in relation to the substrate within certain limits. Furthermore, the spring element ensures that the electrical connection between the transducer element and the substrate can be realized with little expenditure.

The transducer element may be mechanically connected to the spring element, the fastening of the transducer element to the cover being able to be more rigid than the mechanical connection between the transducer element and the substrate that is formed by the spring element.

The force that is required to move the transducer element in relation to the substrate can accordingly be smaller than the force that is required to move the transducer element by the same distance in relation to the cover. The force may be a compressive, tensile or shear force.

In particular, the fastening of the transducer element to the cover may be ten times more rigid than the mechanical connection between the transducer element and the substrate that is formed by the spring element. In this case, the force that is required to move the transducer element in relation to the cover is at least ten times the force that is required to move the transducer element by the same distance in relation to the substrate.

The fastening of the transducer element to the cover may also be one hundred times more rigid than the mechanical connection between the transducer element and the substrate that is formed by the spring element.

Accordingly, the spring element primarily serves only for providing electrical contact between the transducer element and the substrate and does not represent a stable mechanical fastening in the actual sense. Rather, the mechanical connection is resiliently designed and can thus provide a mechanical decoupling of the transducer element and the substrate. As described above, this allows both production tolerances to be compensated and forces that are transferred through the cover to the transducer element to be absorbed.

The spring element may have a clear height of at least 50 µm. In the case of a spring element with such a clear height, the production tolerances that usually occur are compensated sufficiently well, so that in the production of the microphone only a very small proportion of microphones are produced outside prescribed specification limits.

The greater the clear height of the spring element is chosen to be, the better the production tolerances can be compensated and the better the transducer element can be mechanically decoupled from the substrate. On the other hand, the overall height of the microphone should not be chosen to be too great, in order not to increase the overall height of the microphone unnecessarily. The microphone could be used for installing in mobile communication devices, where a prescribed overall height of the microphone should not be exceeded. It should also be noted that, with an increasing clear height of the spring element, the tolerances of the spring element itself also increase.

In the relaxed state, the clear height of the spring element may be within a range of 30 to 250 µm, preferably 50 to 200 µm.

In the assembly of the microphone, the maximum clear height of the spring element may be reduced by an elastic prestressing of the spring element, for example to 200 µm or to 150 µm. In the finished microphone, i.e. in the assembled state, the clear height of the spring element may accordingly be within a range of 30 to 200 µm, preferably 50 to 200 µm, or a range of 30 to 150 µm, preferably 50 to 150 µm. Spring elements with a clear height in these ranges represent a good compromise between the aforementioned requirements.

The spring element may have an upper side, which is facing the transducer element, it being possible for a spacer to be arranged between the spring element and the transducer element in such a way that a gap of a height that corresponds at least to the height of the spacer is formed between the transducer element and the upper side of the spring element.

The spacer particularly allows the later further processing of the microphone to be significantly simplified. If, for example, the contact between the transducer element and the spring element is provided by a soldered connection, it may be required during a subsequent soldering of the microphone onto a printed circuit board to heat the microphone to a temperature above the melting temperature of the soldered connection. In this case, the spacer ensures that the soldered connection is not crushed between the spring element and the transducer element. The spacer can accordingly ensure that a temporarily melted soldered connection can later solidify again to form a reliable connection.

In particular, the contact between the transducer element and the upper side of the spring element may be provided by a soldered connection and a material of the spacer has a higher melting point than the soldered connection. In this way it is ensured that the spacer remains unaffected at temperatures that lead to a melting of the soldered connection, and accordingly can ensure even at these temperatures that the transducer element and the spring element remain correctly aligned in relation to one another and remain arranged at the intended distance from one another.

The spring element may have a first region, in which it is plastically elongated, and a second region, which is largely free of any plastic elongation. The term "largely free" means here that the second region is elongated to a lesser degree, at least by a factor of 10, in comparison with the first region, preferably to a lesser degree at least by a factor of 100. For example, the spring element may be designed in such a way that a force exerted on the spring element that acts perpendicularly to the substrate and away from the substrate leads to a deformation of the first region and the second region remains undeformed under the effect of the force.

The soldered connection and/or the spacer are preferably arranged in the second region. In this way it can be ensured that the alignment between the spring element and the transducer element is not influenced by the plastic elongation of the spring element. The spring element is accordingly designed in such a way that it is deliberately plastically deformed at certain locations under the effect of the force.

The spring element may have a local constriction of a cross section. Accordingly, the spring element may have a region with the local constriction, this region having a smaller cross section than the adjoining regions of the spring element. Accordingly, this region has a greater tendency to be plastically deformed under the effect of an external force. The region of the local cross-sectional constriction therefore makes it possible to deliberately control how and in what regions the spring element is plastically deformed.

The spring element may also have a meandering region, a folded region or an arcuate region. Other non-straight regions are also possible. Common to all of these regions is that they are plastically deformed more easily under the effect of an external force. Furthermore, the spring element may have second regions, which are designed as straight.

Furthermore, the fastening of the transducer element to the cover may be designed in such a way that it acoustically seals off a front volume of the transducer element from a rear volume of the transducer element. Accordingly, in this case no further sealing elements are required between the front volume and the rear volume.

According to a further aspect, the present invention also relates to a method for producing a microphone. The microphone produced according to this method may be the microphone described above. Accordingly, the method may have any functional or structural feature that is disclosed together with the microphone. Conversely, the microphone may have any structural or functional feature that is disclosed here in connection with the method.

The method comprises the steps of: producing a spring element on a substrate, providing electrical contact between a transducer element and the spring element, pulling the transducer element in a direction away from the substrate, the spring element being elongated in this direction, and providing a cover on the substrate, the transducer element being fastened to the cover.

The fact that the spring element and the cover are together pulled away from the substrate means that the clear height of the spring element can be decisively increased, so that this method makes it possible to produce spring elements with a great clear height without increasing the material requirement for the production method. In addition, the method step of the elongation can be performed very quickly, so that the duration of the method increases only insignificantly in the production of a spring element with a great clear height.

The spring element can be plastically elongated by the pulling on the transducer element. Accordingly, an elongation of the spring element is retained even when a pulling device is detached from the transducer element.

The spring element may in particular be produced by the following steps: applying a structured sacrificial layer to the substrate, applying a structured layer to the sacrificial layer, and removing the sacrificial layer, whereby the structured layer is formed into the spring element.

The structured layer may for example consist of metal. The spring element is accordingly produced photolithographically.

The spring element may be elongated in such a way that, after the elongation, a clear height of the spring element is at least 1.5 times the clear height of the spring element before the elongation. The clear height of the spring element may preferably be at least twice the clear height of the spring element before the elongation. The elongation of the spring element accordingly makes it possible to increase the clear height of the spring element considerably. The elongation of the spring element is clearly advantageous in comparison with the photolithographic production of the spring element with a great clear height, since the elongation only takes up a short time in the method and increasing the clear height by elongation does not increase the material requirement.

The pulling of the transducer element may comprise the following sub-steps: fastening a pulling device to a rear side of the transducer element that is facing away from the substrate by means of a releasable adhesive means, pulling on the pulling device in a direction away from the substrate, and detaching the pulling device from the transducer element by releasing the releasable adhesive means.

The releasable adhesive means can be released by heating and/or by exposure to UV radiation. This manner of pulling the transducer element offers the advantage that the pulling device can be detached from the transducer element without leaving any residue. Furthermore, a large number of transducer elements can be treated simultaneously with a single pulling device, which particularly when producing a large number of microphones from a wafer simplifies the production method and reduces the time for the method.

The transducer element may be pulled in a direction away from the substrate over a length that is established on the basis of measuring a displacement or force. By contrast with a pulling length that is fixed in advance, a length that is established on the basis of measuring a displacement or force makes it possible to allow better for different production tolerances and to compensate for them.

BRIEF DESCRIPTION OF THE DRAWINGS

The microphone and preferred exemplary embodiments are explained in more detail below on the basis of the figures, in which.

DETAILED DESCRIPTION OF ILLUSTRATIVE EMBODIMENTS

Figure 1:
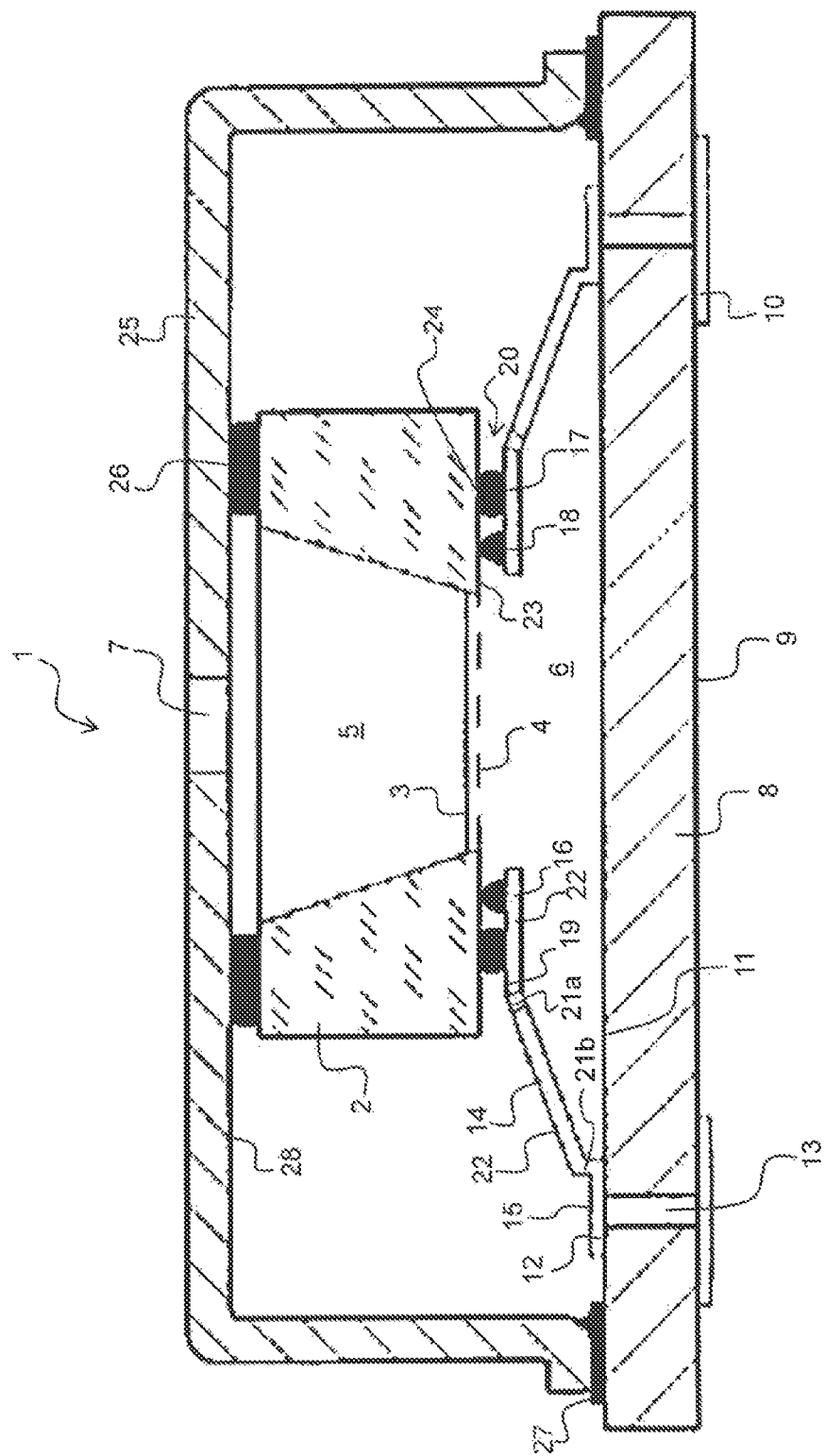
FIG. 1 shows a first exemplary embodiment of a microphone.

FIG. 1 shows a first exemplary embodiment of a microphone 1. The microphone 1 has a transducer element 2. The transducer element 2 has a diaphragm 3 and a fixed back plate 4. A voltage is applied between the diaphragm 3 and the back plate 4, so that the diaphragm 3 and the back plate 4 form a capacitor. The capacitance of this capacitor is variable, dependent on a detected sound.

The transducer element 2 forms a front volume 5 and a rear volume 6. The front volume 5 is suitable for communicating in terms of pressure with a surrounding of the microphone 1.

The microphone 1 accordingly has a sound entry opening 7, by way of which the front volume 5 can communicate in terms of pressure with the surrounding and by way of which sound can reach the diaphragm 3.

The rear volume 6 of the transducer element 2 is an encapsulated space, in which there is a constant invariable pressure. The transducer element 2 is suitable for measuring a difference between the pressure in the front volume 5 and the pressure in the rear volume 6.

The microphone 1 also has a substrate 8. The substrate 8 has on an underside 9, facing away from the transducer element 2, terminals lo for providing electrical contact. On an upper side 11, facing the transducer element 2, the substrate 8 likewise has terminals 12 for providing electrical contact. The substrate 8 also has plated-through holes 13, by way of which the terminals 12 on the upper side 11 are electrically connected to the terminals 10 on the underside 9. It is also possible that the transducer element 2 is internally interconnected only with a further chip component (not shown), for example an ASIC, and the latter component is connected to the terminals 12.

The microphone 1 has a spring element 14. The spring element 14 has at least two springs. The spring element 14 is in electrical contact with the substrate 8. A first end 15 of the spring element 14 is arranged on the terminals 12 on the upper side 11 of the substrate 8.

The spring element 14 is also in electrical contact with the transducer element 2. For this purpose, a second end 16 of the spring element 14 is in electrical contact with the transducer element 2. In the exemplary embodiment shown in FIG. 1, the spring element 14 is in electrical contact with the transducer element 2 by way of a soldered connection 17, which is provided at the second end 16 of the spring element 14. In alternative embodiments, the spring element 14 may be in electrical contact with the transducer element 2 for example by way of stud bumps or by means of a conductive adhesive.

In particular, the transducer element 2 has on an underside 23 facing the substrate 8 terminal areas 24, which are in electrical contact with the spring element 14.

Furthermore, a spacer 18 is arranged between the second end 16 of the spring element 14 and the transducer element 2. The spacer 18 and the soldered connection 17 are provided on an upper side 19 of the spring element 14 that is facing the transducer element 2. Formed between the upper side 19 of the spring element 14 and the transducer element 2 is a gap 20. The gap 20 has a height that corresponds at least to the height of the spacer 18. Accordingly, the spacer 18 ensures that the upper side 19 of the spring element 14 and the transducer element 2 are always spaced apart from one another at least by the height of the spacer 18.

If the microphone 1 is later soldered onto a printed circuit board (not shown), in order for example to be fitted in a cell phone, it is thereby exposed to high temperatures, which leads to melting of the soldered connection 17. The spacer 18 then ensures that even in this case the transducer element 2 and the spring element 14 remain at a fixed distance from one another, and consequently do not impair the then liquid solder. In particular, the spacer 18 is arranged near the soldered connection 17. Consequently, the spacer 18 prevents the spring element 14 from compressing the soldered connection 17 to an inadmissible degree during the melting of the soldered connection if the spring element 14 is elastically prestressed.

The spacer 18 may be a correspondingly structured element of metal or plastic, for example dispensed or jetted polymer structures. The spacer 18 may also be produced directly during the structuring process of the spring element 14 and accordingly be formed as one part with the spring element 14.

The transducer element 2 is in electrical contact with the substrate 8 by way of the spring element 14. Accordingly, the spring element 14 comprises a conductive material. The spring element 14 may for example be formed by a structured metal layer. The spring element 14 has first regions 21a, 21b, in which it is plastically deformed. In the case of the exemplary embodiment shown in FIG. 1, the spring element 14 has a first first region 21a and a second first region 21b. The first first region 21a has a local cross-sectional constriction. Here, the spring element 14 accordingly has a cross section that is reduced in comparison with the cross section in the adjacent regions. The spring element 14 also has the second first region 21b, which is formed by a step of the spring element 14. The step is arranged near the first end 15 of the spring element 14 and ensures that in this region the spring element 14 extends perpendicularly away from the substrate 8.

The spring element 14 has a second region 22, in which it is not plastically deformed. The spring element 14 has in particular a number of second regions 22. The spacer 18 and the soldered connection 17 are arranged in one of the second regions 22. The second region 22, in which the spacer 18 and the soldered connection 17 are arranged, is arranged parallel to the substrate 8 and parallel to the terminal area 24 of the transducer element 2. Even during the melting of the soldered connection 17, the solder will therefore not flow away out of this second region 22.

The microphone 1 also has a cover 25. The transducer element 2 is fastened to the cover 25. The transducer element 2 is arranged between the cover 25 and the substrate 8. The microphone 1 also has a sound insulator 26, by way of which the transducer element 2 is connected to the cover 25 and which separates the front volume 5 of the transducer element 2 acoustically from the rear volume 6 of the transducer element 2. The rear volume 6 of the transducer element 2 is enclosed by the cover 25, the sound insulator 26, the transducer element 2 and the substrate 8.

The cover 25 also has an opening, by way of which the front volume 5 of the transducer element 2 can communicate in terms of pressure with the surrounding and which forms the sound entry opening 7 of the microphone 1.

The cover 25 is electrically conductive throughout, or at least in sub-layers. The cover 25 is designed for being brought into electrical contact with a shielding of the substrate 8. Consequently, the cover 25 is suitable for keeping incoming electromagnetic radiation from outside away from the transducer element 2. For this purpose, the cover 25 is fastened to the substrate 8 by means of a fastening means 27, for example by means of solder, an adhesive or a combination of the two. The adhesive may be conductive.

The transducer element 2 is fastened to an inner side 28 of the cover 25 that is facing the substrate 8. The transducer element 2 is directly fastened to the inner side 28 of the cover 2 by the sound insulator 26.

The sound insulator 26 comprises a flexible adhesive, which fastens the transducer element 2 directly to the cover 25. Alternatively or additionally, the sound insulator 26 may comprise a plastic material, which fastens the transducer element 2 directly to the cover 25. The sound insulator 26 surrounds the sound entry opening 7 uninterruptedly and consequently forms the acoustic seal between the front volume 5 and the rear volume 6.

The transducer element 2 is also mechanically fastened to the spring element 14. The mechanical fastening of the transducer element 2 to the spring element 14 is however practically free of forces. In particular, the mechanical fastening of the transducer element 2 to the cover 25 is more rigid than the mechanical fastening of the transducer element 2 to the spring element 14. The fastening of the transducer element 2 to the spring element 14 consequently does not represent fastening in the actual sense, but merely forms an electrical contact.

In FIGS. 2 to 6, a production method for producing a microphone 1 according to the first exemplary embodiment is shown. In each of FIGS. 2 to 6, just a single microphone 1 is shown at different points in time of the production method. The method described here makes it possible however to produce a large number of microphones 1 simultaneously on a wafer, the respective method steps for each microphone 1 being carried out at the same time.

Figure 2:
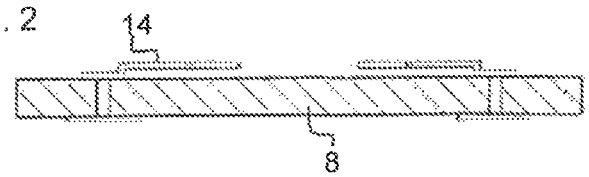
FIGS. 2 to 6 show various steps of a method for producing the microphone according to the first exemplary embodiment.

FIG. 2 shows the microphone 1 after a first method step, in which the spring element 14 has been produced on the substrate 8 in a photolithographic process.

The spring element 14 is in this case produced by a structured sacrificial layer (not shown) first being applied to the substrate 8. The thickness of the structured sacrificial layer corresponds to the clear height of the spring element 14 that is later produced. The sacrificial layer may have a thickness in the range of 1 to 30 μm.

Subsequently, a structured layer, for example a structured metal layer, is applied over the sacrificial layer. Then, the sacrificial layer is removed again, the structured layer remaining. Then the spring element 14 is formed by the structured layer.

Figure 3:
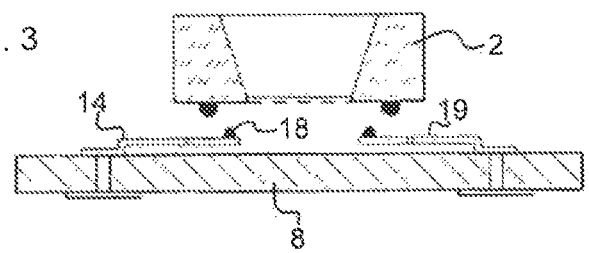

FIG. 3 shows the microphone 1 during a further method step, in which the transducer element 2 is placed on the spring element 14.

Before this method step, the transducer element 2 was also provided with solder bumps, which later form the soldered connection 17. Alternatively, the solder bumps that later form the soldered connection 17 could be applied to the upper side 19 of the spring element 14. Furthermore, spacers 18, which in the finished microphone 1 are arranged near the soldered connection 17 in order to ensure a minimum height of the gap 20 between the transducer element 2 and the upper side 19 of the spring element 14, were applied to the upper side 19 of the spring element 14. Alternatively, the spacer 18 could be applied to the underside of the transducer element 2.

Figure 4:
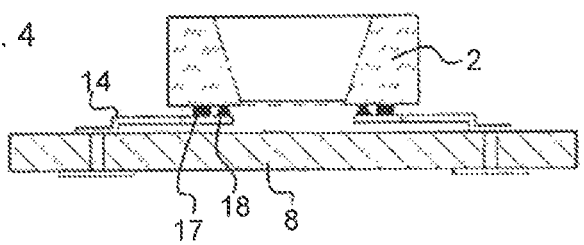

FIG. 4 shows the microphone 1 in a state in which the transducer element 2 has been placed on the spring element 14 and soldered to it. Accordingly, an electrical connection has been established between the transducer element 2 and the spring element 14. The solder bumps then form the soldered connection 17.

Figure 5:
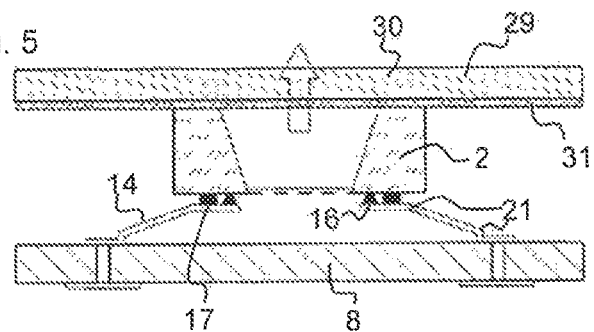

FIG. 5 shows the microphone 1 after a further method step. Here, a pulling device 29 is connected to the transducer element 2. The pulling device 29 has a planar plate 30. The underside of the planar plate 30 that is facing the transducer element 2 is coated with a releasable adhesive means 31, for example with a thermal release tape, for example REVALPHA from Nitto Denko.

The pulling device 29 is first pressed onto the microphone 1 in such a way that the releasable adhesive means 31 is attached to an upper side of the transducer element 2 that is facing away from the substrate 8. The pulling device 31 is subsequently pulled with a certain pulling force in a direction away from the substrate 8. The pulling device 29 thereby pulls the transducer element 2 away from the substrate 8. The spring element 14, which is mechanically connected to the transducer element 2 by way of the soldered connection 17, also follows this pulling force and is thereby elongated in the direction away from the substrate 8. The spring element 14 is designed in such a way that it is thereby plastically elongated.

The plastic elongation of the spring element 14 has the effect of increasing its clear height. In particular, the clear height of the spring element 14 is increased to at least 30 μm. The pulling in the direction away from the substrate allows the clear height of the spring element 14 to be increased in such a way that it then lies in a range of 30 to 250 μm, preferably of 50 to 200 μm. In particular, the clear height is increased in comparison with the clear height before the elongation by at least 1.5 times, preferably at least twice.

If in a further method step the cover 25 is arranged over the transducer element 2, the spring element 14 is thereby compressed and elastically deformed. As a result, the maximum clear height of the spring element 14 is reduced to 150 μm.

During the pulling in the direction away from the substrate 8, the spring element 14 is plastically deformed. This plastic deformation takes place virtually exclusively in the first regions 21a, 21b of the spring element 14. Both the first region 21b, which has the step, and the first region 21a, which has the local cross-sectional constriction, are deformed to a high degree during the pulling of the spring element 14. The spring element 14 is in each case bent away at the step and in the region of the cross-sectional constriction. On the other hand, the second end 16 of the spring element 14, in the vicinity of which the soldered connection 17 is arranged, remains substantially parallel to the transducer element 2.

The pulling device 29 has a control unit (not shown), which on the basis of measuring a displacement or force establishes the deflection by which the spring element 14 is elongated. The pulling device 29 pulls the second end 16 of the spring element 14 away from the substrate 8 in the direction of the normal to the surface and provides a plastic elongation of the spring element 14 to a required extent. When setting the elongation by the pulling device 29, it should also be taken into consideration that, apart from the plastic elongation, the spring element 14 also undergoes a partial elastic elongation, by which it springs back after the release of the pulling device 29.

Figure 6:
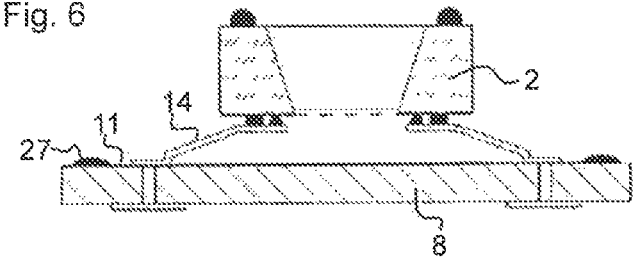

FIG. 6 shows the microphone 1 after a further method step. In this further method step, the pulling device 29 was detached from the transducer element 2. This may take place by heating the pulling device 29 to a temperature above the release temperature, whereby the bonding attachment of the releasable adhesive means 31 is ended. The release temperature may be for example 150°. In alternative embodiments, the releasable adhesive means 31 may be released by exposure to UV radiation.

Furthermore, the fastening means 27, by means of which the cover 25 is later connected to the substrate 8, was arranged on the upper side 11 of the substrate 8 that is facing the transducer element 2.

FIG. 6 also shows that a sealing means, which in the finished microphone 1 forms the sound insulator 26, is applied to the transducer element 2. The sealing means may alternatively also be arranged on the inner side 28 of the cover 25. The latter is easier under some circumstances, since at the point in time of the method that is shown in FIG. 6 the transducer element 2 is not fastened, but only carried by the spring elements 14.

In a final method step, the cover 25 is then applied and connected in its peripheral regions to the substrate 8. The sound insulator 26 is thereby also produced between the transducer element 2 and the cover 25 around the sound entry opening 7. Consequently, the microphone 1 that is shown in FIG. 1 is then obtained.

When placing on the cover 25, the spring element 14 may also be elastically compressed. Accordingly, in the case of the finished microphone 1 the spring element 14 may have an elastic stress in a direction away from the substrate 8.

Figure 7:
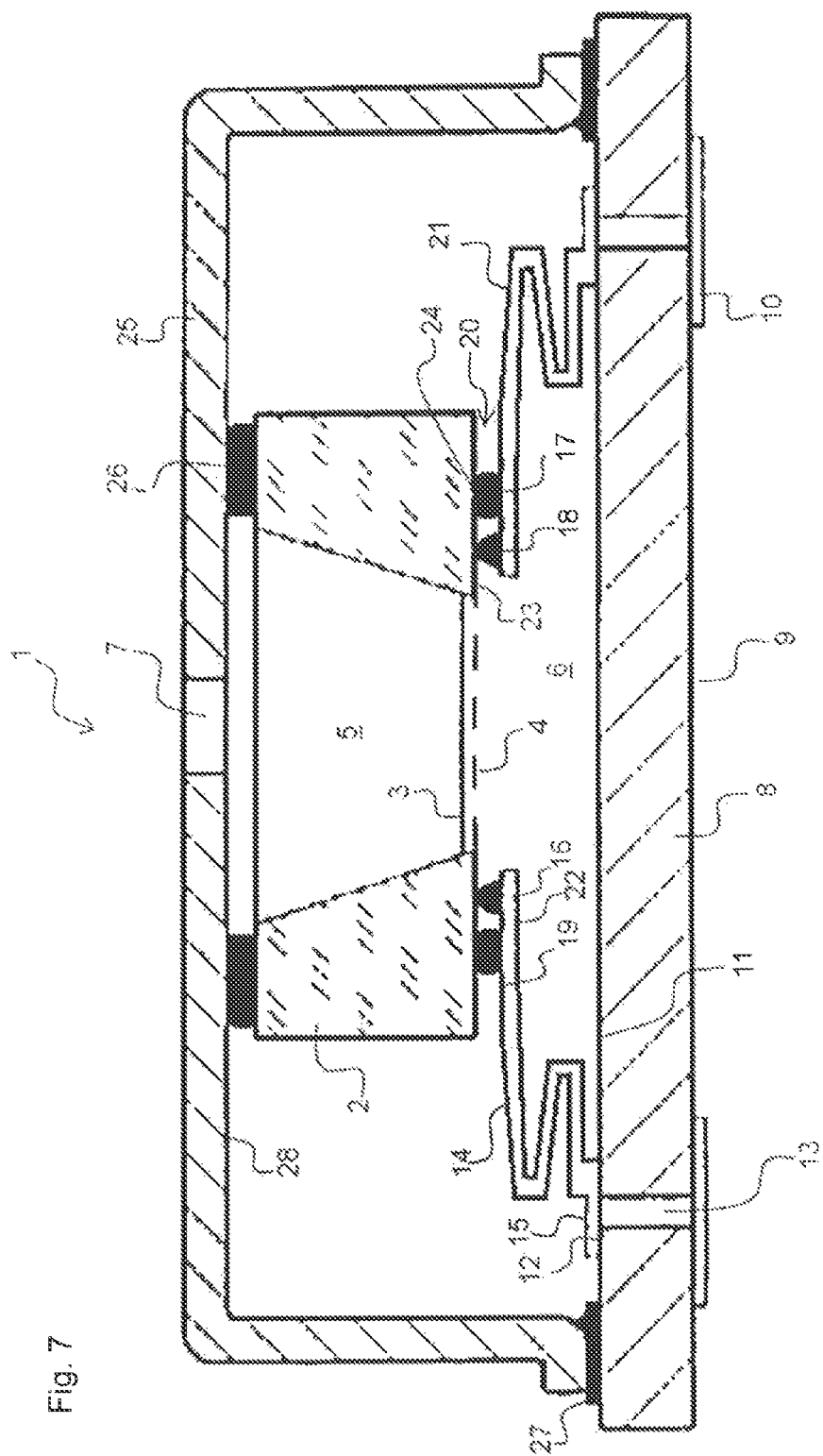
FIG. 7 shows a second exemplary embodiment of the microphone.

FIG. 7 shows a microphone 1 according to a second exemplary embodiment, in which the spring element 14 has a meandering first region 21, in which it is plastically elongated. The length of the spring element 14 may be designed in such a way that it is at least twice the shortest connection between the first end 15 and the second end 16 of the spring element 14.

The invention claimed is:

1. A microphone comprising:
   a substrate;
   a spring element plastically elongated in a direction perpendicular to the substrate;
   a transducer element in electrical contact with the substrate by way of the spring element; and
   a cover to which the transducer element is fastened, wherein the transducer element is arranged between the cover and the substrate, and
   wherein the spring element has a clear height of at least 30 μm.

2. The microphone according to claim 1, wherein the transducer element is mechanically connected to the spring element, and wherein a fastening of the transducer element to the cover is more rigid than a mechanical connection of the transducer element to the spring element.

3. The microphone according to claim 1, wherein the spring element has a clear height in a range of 30 μm to 250 μm.

4. The microphone according to claim 1, wherein the spring element has an upper side that faces the transducer element, and wherein a spacer is arranged between the spring element and the transducer element in such a way that a gap of a height that corresponds at least to the height of the spacer is formed between the transducer element and the upper side of the spring element.

5. The microphone according to claim 4, wherein a contact between the transducer element and the upper side of the spring element comprises a soldered connection, and wherein a material of the spacer comprises a higher melting point than the soldered connection.

6. The microphone according to claim 1, wherein the spring element has a first region, in which it is plastically elongated, and a second region, which is largely free of any plastic elongation.

7. The microphone according to claim 1, wherein the spring element has a local constriction of a cross section, and/or wherein the spring element has a meandering region, a folded region or an arcuate region.

8. The microphone according to claim 1, wherein a fastening of the transducer element to the cover is designed such that a front volume of the transducer element is acoustically sealed off from a rear volume of the transducer element.

9. A method for producing a microphone, the method comprising:
producing a spring element on a substrate;
providing electrical contact between a transducer element and the spring element;
pulling the transducer element in a direction away from the substrate, the spring element being elongated in this direction; and
fastening the transducer element to a cover that is located on the substrate.

10. The method according to claim 9, wherein the spring element is plastically elongated by pulling on the transducer element.

11. The method according to claim 9, wherein the spring element is produced as follows:
applying a structured sacrificial layer to the substrate;
applying a structured layer to the sacrificial layer; and
removing the sacrificial layer, whereby the structured layer is formed into the spring element.

12. The method according to claim 9, wherein the spring element, after the elongation, provides a clear height of at least 1.5 times a clear height of the spring element before the elongation.

13. The method according to claim 9, wherein pulling the transducer element comprises:
fastening a pulling device to a rear side of the transducer element that is facing away from the substrate by a releasable adhesive;
pulling on the pulling device in a direction away from the substrate; and
detaching the pulling device from the transducer element by releasing the releasable adhesive.

14. The method according to claim 9, wherein the transducer element is pulled in a direction away from the substrate over a length that is established on a basis of measuring a displacement or force.

15. A microphone comprising:
a substrate;
a spring element plastically elongated in a direction perpendicular to the substrate;
a transducer element in electrical contact with the substrate by way of the spring element; and
a cover to which the transducer element is fastened, wherein the transducer element is arranged between the cover and the substrate, wherein the spring element has an upper side that faces the transducer element, and wherein a spacer is arranged between the spring element and the transducer element in such a way that a gap of a height that corresponds at least to the height of the spacer is formed between the transducer element and the upper side of the spring element.

* * * * *